March 3, 1964 R. S. BURKET ETAL 3,123,209

PACKAGES

Filed Oct. 26, 1961 2 Sheets-Sheet 1

INVENTORS
RICHARD SAMUEL BURKET
ROBERT EDWARD CLOUGH

BY Lynn Barratt Morris
ATTORNEY

March 3, 1964 R. S. BURKET ET AL 3,123,209

PACKAGES

Filed Oct. 26, 1961 2 Sheets-Sheet 2

INVENTORS

RICHARD SAMUEL BURKET
ROBERT EDWARD CLOUGH

BY Lynn Barratt Morris

ATTORNEY

United States Patent Office 3,123,209

Patented Mar. 3, 1964

3,123,209

PACKAGES

Richard Samuel Burket, Old Bridge, N.J., and Robert Edward Clough, Newark, Del., assignors to E. I. du Pont de Nemours and Company, Wilmington, Del., a corporation of Delaware Filed Oct. 26, 1961, Ser. No. 147,924
13 Claims. (Cl. 206—62)

This invention relates to a package of sensitive plates and to corner supports therefor.

In packaging plates having sensitive surfaces it is necessary that the surfaces be kept free from damage during assembly, shipping and removal of the plates from the package. In packaging photopolymerizable printing plates of the types described in U.S. Patents 2,791,504, 2,923,673, 2,927,022 and 2,951,758, which comprises a support and a photopolymerizable layer, the surface must be kept free from dust and untouched so that physical marring or scratching cannot occur during handling and shipping. The presence of dust specks, indentations and abrasions leads to defective printing surfaces during use of the plates by the customer. Conventional packages for non-sensitive plates are not suitable for such purposes.

It is an object of this invention to provide a simple but dependable package of sensitive plates. Another object is to provide a practical package of photopolymerizable plates that is easy to assemble and disassemble and protects the photosensitive surfaces during shipment. A related object is to provide such packages for a plurality of such plates. Still further objects will be apparent from the following description of this invention.

The packages of this invention comprise four corner ladders comprising two spaced sides having top and bottom lateral arms and a plurality of rungs extending between said sides, a plurality of sensitive plates supported by said ladders and having their corners disposed between said sides and rungs, end caps surrounding the corner ladders and supporting said plates, a fastening band extending around said caps and holding them and the plates, and holding the plates and end caps in assembled position and at least one cover for the assembled unit. Thus, the unit may be enclosed in a sealed plastic bag and the latter in a folded box container.

The novel corner ladders of the invention are preferably made of a stiff wire which can be provided with a suitable varnish, resin or plastic coating or which may be electroplated, or provided with a metallic coating, e.g., galvanized. The sides have lateral arms at the top and bottom, and they are preferably disposed at an angle perpendicular to the sides and preferably also the axes of the lateral arms are at right angles to each other. Each of the rungs is perpendicular to each side and a rung near each end of the ladder has a lateral extension disposed at an angle so that the arms lie in the same plane as the side and end edges of the sensitive plates.

Figure 1:
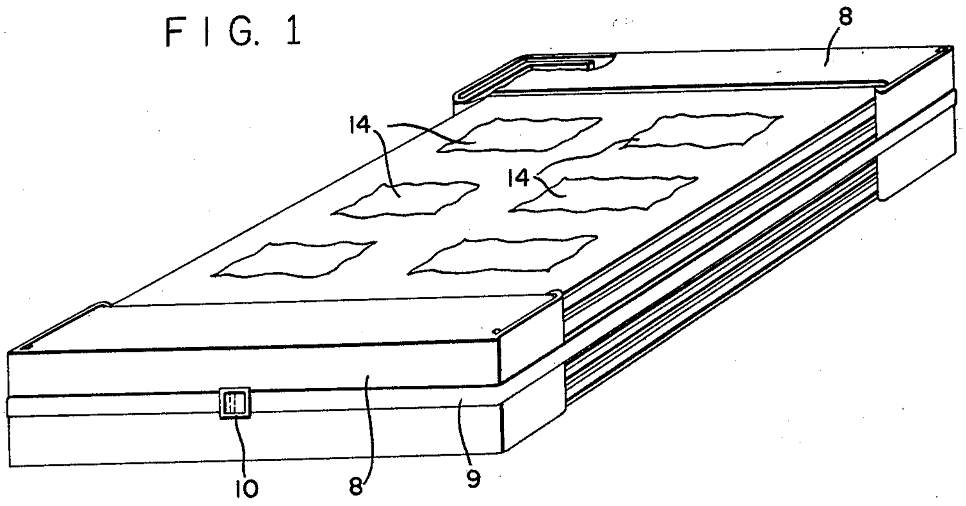
Figure 4:
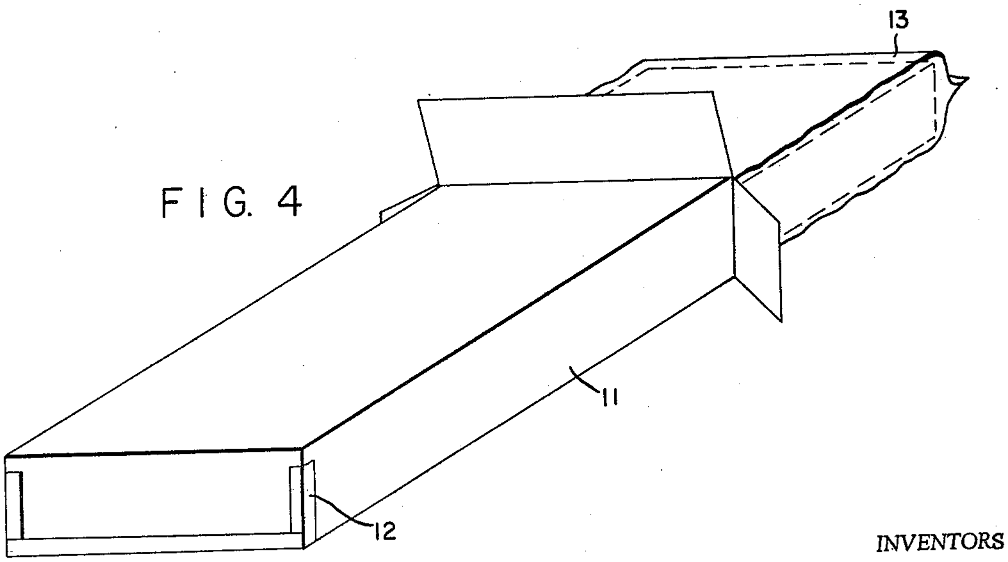
Figure 2:
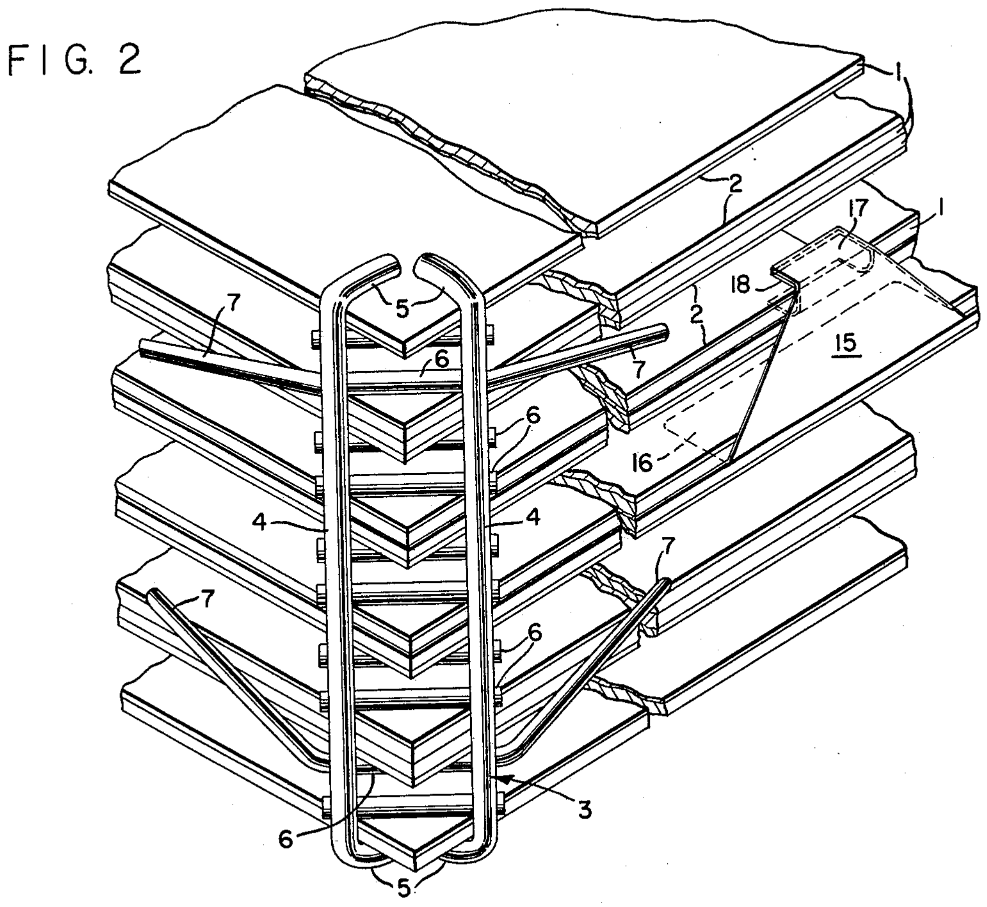
Figure 3:
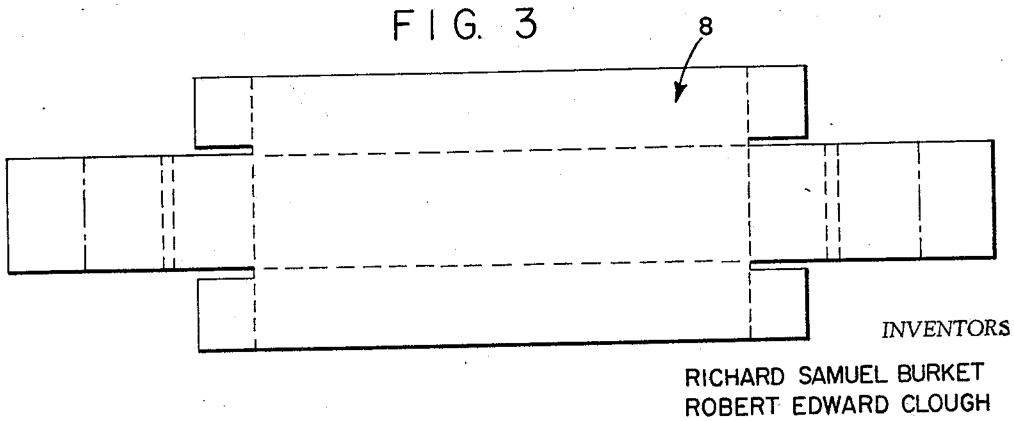

Both the packages and ladders of the invention will now be described with reference to the accompanying drawings which form a part of this invention, and wherein FIG. 1 is a perspective view of an assembled unit of sensitive plates showing the end caps and binding tape;

FIG. 2 is a perspective view of a corner ladder showing parts of the plates in supported relationship and a retaining clip for half-size plates, FIG. 3 is a plan view of the end caps in nonfolded position, and FIG. 4 is a perspective view of the outer carton and plastic pouch containing a unit of assembled plates.

Referring now to the drawing, and more particularly to FIGS. 1 and 2, the novel packages of the invention comprise a plurality of photosensitive plates having a metal base 1, and a photosensitive, e.g., photopolymerizable, layer 2. Each of the corners of the plates interfit with and are supported by corner ladder supports 3. These supports consist of two spaced sides 4 which have laterally extending arms 5 at their top and bottom ends. These arms are preferably disposed at right angles to the sides, and the axes of the two arms are at right angles to each other. A plurality of rungs 6 extend between and are fastened to the sides. These rungs preferably are perpendicular to the axes of the sides and are either integral with or welded, or otherwise firmly attached, to the sides. The rungs are spaced apart a suitable distance so that they are adapted to receive the corners of the sensitive plates.

As shown in FIG. 2 of the drawings, it is preferable to have the uppermost and lowermost rungs spaced a short distance from the lateral arms so that a corner of a single plate can be placed between the rung and the arms. The intermediate rungs are preferably spaced a greater distance apart and are adapted to receive the corners of two contiguous sensitive plates. As shown, the outermost plates have the metal base contacting with the inner surface of the lateral arms. The remaining plates have the bottom surfaces of the metal bases in surface contact so that the photosensitive surfaces are outermost and face each other in the assembled unit. With plates of greater thickness and weights the rung spacing can be different. Also, the rungs can be modified to hold 5, 6, 8, or more plates. The plates can be stacked singly or in back-to-back relationship.

In a preferred form of construction of the corner ladder supports, two of the rungs, one near each end of the ladder, have laterally extended arms 7 which are disposed at an obtuse angle with respect to the main portion of the rungs. These lateral arms are adapted to contact the side and end edges of the photosensitive plates if the plates shift and serve not only as a brace but as a guide for assembling certain of the plates in proper relation, and prevent the ladders from shifting or rotating in the corners of the package.

In FIG. 1 of the drawing, there is shown an assembled unit of the plates, a portion of which are shown in assembled relationship in FIG. 2. Folded end caps 8 extend a short distance along and across the top, sides and bottom of the assembled plates on the four corner ladder supports. These end caps are more fully shown in FIG. 3 in non-folded position. In order to hold the end caps, corner ladder supports, and assembled plates in an assembled position, there is placed around the two end caps a suitable fastening tape 9 which is provided with a suitable fastening clip or buckle 10 for holding the tightened fastening tape in taut condition. The assembled unit of sensitive plates, corner ladders, end caps and fastening tape are then placed in a suitable outer container or carton 11 as shown in FIG. 4 of the drawing. This outer carton may be provided with suitable folded side and end closures for each end thereof. After the carton is in a closed position, the ends may be sealed with a suitable sealing tape 12, or glued in conventional manner.

In the preferred form of the invention, the assembled unit is placed in a suitable bag or pouch 13. This pouch is preferably slightly larger in its dimensions than the assembled unit of plates and can be made of metal foil, a plastic film, or of laminated metal foil, flexible fabric material or a plastic film, and the end (or ends) suitably sealed so as to form a moisture proof and/or lightproof pouch.

As shown in FIG. 1 of the drawing, a plurality of small, flat bags 14 of a desiccant material are placed on the metal surface of the uppermost plate. This desiccant will absorb any water vapor in the package and keep the plates in a dry condition so that their utility is not impaired.

These desiccant bags, of course, are placed on the plate before it is inserted into the pouch or carton.

The invention is not limited to packaging single size plates in a single unit or package. To the contrary, large plates and half-size or even smaller size plates can be placed in the same package in accordance with a further normal aspect of the invention. This aspect is illustrated in FIG. 2 of the drawing where a full-size sensitized plate is placed on the appropriate rungs of the corner ladders. Half size plates are then placed on top of the full size plate. The half size plates are then retained in position by means of the metal bracket 15 which has a lateral end 16 which extends between the metal surfaces of two full size plates. The other end of the bracket has a lateral end 17 of smaller area which fits over the top surface of the two adjoining sensitive plates near the adjacent edges. Beneath this lateral edge there is a coacting lateral shelf portion 18 which forms a clip with parts 15 and 17 to lightly grip the two half plates and hold them in position. Since the lateral end of bracket 15 is of relatively small cross-section, it overlaps only a small portion of the sensitive surface at the adjoining corners. A similar bracket can be placed on the opposite side of the unit in like manner.

The packages of this invention and the units of assembled plates, corner ladders, and end caps can be assembled in various ways in order to make the completed units and packages. In a practical way of assembling the units and packages, a suitable jig is made for holding two corner ladders in position on a horizontal table or support. The plates are then inserted vertically between the upper and lower rungs and lateral arms and between the various rungs. During this assembly, suitable mechanical fingers can hold the upper ends of the plates in approximately the final position. Support ladders can then be placed on the two remaining upper corners. The assembly is then removed from thhe jig and an end cap placed over the corners of each end. A suitable tape or cord fastener is then placed around the end caps and tightened and fastened in a suitable manner. The plastic pouch is then slipped over the assembled unit of plates, corner ladders and end caps, and also the desiccant bags, and the open end is then sealed in any suitable manner, e.g., by folding and pressing, by applying a suitable adhesive, by applying a pressure-sensitive tape or by heat-sealing means. The sealed pounch containing the unit is then inserted in a suitable outer carton and the closure therefor closed and preferably also sealed by means of adhesive tape or glue in any conventional manner. If the carton 11 has the usual folded end closure, the side and edge flaps are closed and glued or sealing tape applied at the line of closure, e.g., at the juncture of the sides and ends.

The sensitive plates can be removed from the package by reversing the steps described above. The pouch end cap unit construction has the advantage that it is not necessary to contact the sensitive surfaces in removing the plates. After the pouch has been removed from the package it is stripped from the assembled unit, the tape or cord fastening means are then cut, the end caps removed and then two of the corner ladders are removed as needed.

As will be apparent from the foregoing description, the corner ladder can be made of various metal, and coated metal, stiff wire of various small cross-sections. The wire can be made of steel and various steel alloys, e.g., stainless steel, nickel steel alloys, titanium, brass, etc. The wire may be round, oval square, rectangular or of other cross-section. In general, they are at least ⅛ inch in at least one cross-dimension. Depending on the weight of the plates to be packaged and the degree of stiffness, the cross-section can vary from about $\frac{1}{16}$ to ¼ inch. The rungs are preferably welded to the sides. In preferred ladders they are made of nickel, or cadmium plated stiff steel wire. However, the wires can be coated with various resins or polymers, e.g., nylon, polyethylene, polystyrene, etc.

The end caps and cartons for the packages described above can be made of cardboard, laminated paper board, corrugated paper board and related materials. When photopolymerizable elements are packaged, it is, of course, preferable that the caps, cartons and pouches be made of dust-free material. Thus, the paper board, cardboard, etc. should have a smooth, dust-free surface and not shred or fray readily. Thus the paper and cardboard can be provided with a suitable sizing or varnish to render them dust-free. The inner surfaces of the carton could, of course, have a lamination of a metal foil or of a plastic film, e.g., cellophane, polyethylene, rubber hydrochloride or other suitable lining material.

The pouch used for the package can be made of any heavy plastic or foil, e.g., polyethylene, and the latter may contain a pigment or dye in order to render it lightproof. The pouch can be made of a laminate of scrim cloth with a polymeric film, e.g., polyethylene, or of a metal foil, e.g., aluminum, or a combination of such materials. The pouch can also be made of a suitable colored or impregnated heavy paper or paper/metal foil laminate or of a paper/cloth or cloth/metal laminate. In the case of heavy paper, e.g., kraft paper, it may be impregnated or coated with wax or a suitable paper varnish.

The clips for half-size plates can be made from sheets of the metals and metal alloys described above for the ladders. Similarly, the clips may be coated or plated with the same materials described above for the corner ladders.

In place of the fastening tape 9 shown in the drawings, which is preferably assembled of heavy strands and made of nylon, rayon, polyethylene terephthalate threads or filaments or other suitable synthetic materials, there can be substituted a cord made of such materials. Also, there could be used thin metal strappings or tapes, e.g., steel, brass, aluminum, etc. Instead of tapes, wire fastening materials can be used. After the tape, cord or wire is tightened, the ends can be fastened together by any suitable metal or plastic clip, buckle or other fastener.

The desiccant bags used in the packages can be made of any suitable porous, smooth paper or plastic material. In the case of non-porous plastic films the material for the bag may contain minute perforations. Various desiccants can be used in the bags and a practical one is anhydrous silica gel.

While the present invention has been described primarily for the packaging of photosensitive plates and, more particularly, photopolymerizable printing plates, it is, of course, obvious that other types of non-frangible or non-brittle plates having a sensitive surface can be packaged in like manner. To be more specific, the invention is useful for packaging pre-sensitized printing plates for offset printing. In addition, the invention can be used to package and protect the surface of ferrotype plates, copper engravings and other sensitive materials.

The invention has the advantage that the packages are simple in construction and easy to assemble and disassemble. The commercially available cartons, pouches and end caps can be used in making the packages, which is a distinct commercial advantage.

An important commercial advantage of the invention is that the packages are relatively light in weight and yet give adequate protection to the sensitive plates. The completed packages, thus, can be shipped by common carriers without damage to the contents. Another important advantage resides in the fact that the corner ladder feature limits surface damage to the sensitive plate in a very small area in its corners. This area is outside of the normal image area.

Still other advantages will be apparent to those skilled in the art from the foregoing description of the invention.

What is claimed is:

1. A package of sensitive plates comprising (1) four corner ladder supports, each ladder support comprising (*a*) two parallel spaced sides terminating in integral lateral arms at its top and bottom, (b) a plurality of parallel spaced rungs extending between said sides and perpendicular to the axes of the sides, the lateral arms being at right angles to the axes of the respective sides, at least two of said rungs having at each end (c) lateral extensions disposed at an angle to the rung, the extensions from each rung forming an included right angle with respect to each other and an oblique angle with respect to the sides of the ladder support, (2) a plurality of sensitive plates supported by said ladder supports said plates having their respective corners disposed between said sides and rungs, (3) end caps surrounding the supported plates and ladder supports and extending along the top, bottom and sides of the assembly of plates and ladder supports, (4) a fastening member extending around all of the ladder supports, and (5) a protective casing for the assembled unit of plates, ladder supports and caps.

2. A package according to claim 1 wherein the lateral extensions of the rungs which are at the oblique angle are directed inwardly toward each other.

3. A package of sensitive plates comprising (1) four corner ladder supports, each ladder support comprising (a) two parallel spaced sides terminating in integral lateral arms at its top and bottom, (b) a plurality of parallel spaced rungs extending between said sides and perpendicular to the axes of the sides, the lateral arms being at right angles to the axes of the respective sides, at least two of said rungs having at each end (c) lateral extensions disposed at an angle to the rung, the extensions from each rung forming an included right angle with respect to each other and an oblique angle with respect to the sides of the ladder support, (2) a plurality of sensitive plates supported by said ladder support said plates having their respective corners disposed between said sides and rungs, (3) end caps surrounding the supported plates and ladder supports and extending along the top, bottom and sides of the assembly of plates and ladder supports, (4) a fastening member extending around all of the caps, and (5) a protective casing for the assembled unit of plates, ladder supports and caps.

4. A package of sensitive plates comprising (1) four corner ladder supports, each ladder support comprising (a) two parallel spaced sides terminating in integral lateral arms at its top and bottom, (b) a plurality of parallel spaced rungs extending between said sides and perpendicular to the axes of the sides, the lateral arms being at right angles to the axes of the respective sides, at least two of said rungs having at each end (c) lateral extensions disposed at an angle to the rung, the extensions from each rung forming an included right angle with respect to each other and an oblique angle with respect to the sides of the ladder support, (2) a plurality of sensitive plates supported by said ladder supports said plates having their respective corners disposed between said sides and rungs, (3) end caps surrounding the supported plates and ladder supports and extending along the top, bottom and sides of the assembly of plates and ladder supports, (4) a fastening member extending around all of said ladder supports, (5) a protective pouch encasing the assembled unit of plates, ladder supports and caps, and (6) an outer carton enclosing said pouch.

5. A package of sensitive plates comprising (1) four corner ladder supports, each ladder support comprising (a) two parallel spaced sides terminating in integral lateral arms at its top and bottom, (b) a plurality of parallel spaced rungs extending between said sides and perpendicular to the axes of the sides, the lateral arms being at right angles to the axes of the respective sides, at least two of said rungs having at each end (c) lateral extensions disposed at an angle to the rung, the extensions from each rung forming an included right angle with respect to each other and an oblique angle with respect to the sides of the ladder support, (2) a plurality of sensitive plates supported by said ladder supports said plates having their respective corners disposed between said sides and rungs, (3) end caps surrounding the supported plates and ladder supports and extending along the top, bottom and sides of the assembly of plates and ladder supports, (4) a fastening member extending around all of said caps, (5) a protective pouch encasing the assembled unit of plates, ladder supports and caps, and (6) an outer carton enclosing said pouch.

6. A package according to claim 5 wherein said photosensitive plates comprise a metal base and a photopolymerizable layer.

7. A package of sensitive plates comprising (1) four corner ladder supports, each ladder support comprising (a) two parallel spaced sides terminating in integral lateral arms at its top and bottom, (b) a plurality of parallel spaced rungs extending between said sides and perpendicular to the axes of the sides, the lateral arms being at right angles to the axes of the respective sides, at least two of said rungs having (c) lateral extensions disposed at an angle to the rung, the extensions from each rung forming an included right angle with respect to each other and an oblique angle with respect to the sides of the ladder support, (2) a plurality of sensitive plates supported by said ladder supports said plates having their respective corners disposed between said sides and rungs, (3) end caps surrounding the supported plates and ladder supports and extending along the top, bottom and sides of the assembly of plates and ladder supports, (4) a fastening member extending around all of the ladder supports, and (5) a protective casing enclosing the assembled unit of plates, ladder supports and caps; said package containing half-size plates in back-to-back relationship with a full size plate, a clip extending around the half-size plates at their adjoining corners, the clip being at one end of a bracket the other lateral end of which bracket extends between the back surfaces of two adjacent plates.

8. A package of sensitive plates comprising (1) four corner ladder supports, each ladder support comprising (a) two parallel spaced sides terminating in integral lateral arms at its top and bottom, (b) a plurality of parallel spaced rungs extending between said sides and perpendicular to the axes of the sides, the lateral arms being at right angles to the axes of the respective sides, at least two of said rungs having (c) lateral extensions disposed at an angle to the rung, the extensions from each rung forming an included right angle with respect to each other and an oblique angle with respect to the sides of the ladder support, (2) a plurality of sensitive plates supported by said ladder supports said plates having their respective corners disposed between said sides and rungs, (3) end caps surrounding the supported plates and ladder supports and extending along the top, bottom and sides of the assembly of plates and ladder supports, (4) a fastening member extending around all of the caps, and (5) a protective casing enclosing the assembled unit of plates, ladder supports and caps; said package containing half-size plates in back-to-back relationship with a full size plate, a clip extending around the half-size plates at their adjoining corners, the clip being at one end of a bracket the other lateral end of which bracket extends between the back surfaces of two adjacent plates.

9. A corner ladder support comprising (*a*) two parallel spaced sides terminating in integral lateral arms at its top and bottom, (*b*) a plurality of parallel spaced rungs extending between said sides and perpendicular to the axes of the sides, the lateral arms being at right angles to the axes of the respective sides, at least two of said rungs having (*c*) lateral extensions at each end disposed at an angle to the rung, the extensions from each rung forming an included right angle with respect to each other and an oblique angle with respect to the sides of the ladder support.

10. A support according to claim 9 wherein the lateral extensions of the rungs which are at the oblique angle are directed inwardly toward each other.

11. A ladder support according to claim 9 wherein the sides, rungs and arms are made of stiff wire and have a corrosion resistant surface.

12. A ladder support according to claim 9 wherein the sides, rungs and arms are made of stiff wire.

13. A ladder support according to claim 9 wherein the wire is round and small in diameter.

References Cited in the file of this patent

UNITED STATES PATENTS

| | | |
|---|---|---|
| 402,827 | Hoover | May 7, 1889 |
| 1,929,161 | Coffin et al. | Oct. 3, 1933 |
| 2,420,940 | Eldridge | May 20, 1947 |
| 2,556,529 | Farrell | June 12, 1951 |
| 2,620,921 | Schaller | Dec. 9, 1952 |
| 2,845,183 | Paulsen | July 29, 1958 |
| 2,898,026 | Aid | Aug. 4, 1959 |